United States Patent
Walter (10) Patent No.: US 9,768,094 B2
(45) Date of Patent: Sep. 19, 2017

(54) POWER ELECTRONICS MODULE WITH LOAD CONNECTION ELEMENTS

(71) Applicant: Semikron Elektronik GmbH & Co., KG, Nürnberg (DE)

(72) Inventor: Christian Walter, Ansbach (DE)

(73) Assignee: Semikron Elektronik GmbH & Co., KG, Nürnbergm (DE)

( * ) Notice: Subject to any disclaimer, the term of this patent is extended or adjusted under 35 U.S.C. 154(b) by 0 days.

(21) Appl. No.: 15/206,303

(22) Filed: Jul. 10, 2016

(65) Prior Publication Data
US 2017/0011985 A1    Jan. 12, 2017

(30) Foreign Application Priority Data
Jul. 10, 2015    (DE) .................. 10 2015 111 204

(51) Int. Cl.
*H05K 7/20*    (2006.01)
*H05K 7/14*    (2006.01)
(Continued)

(52) U.S. Cl.
CPC ...... *H01L 23/3675* (2013.01); *G01R 19/0092* (2013.01); *H01L 23/043* (2013.01);
(Continued)

(58) Field of Classification Search
CPC .......... H01L 23/3675; H01L 23/49838; H01L 23/043; H01L 24/48; H01L 23/473;
(Continued)

(56) References Cited

U.S. PATENT DOCUMENTS

| 6,373,705 B1* | 4/2002 | Koelle ............... H01L 23/36 165/104.33 |
| 2005/0087849 A1* | 4/2005 | Morita ............... H01L 24/48 257/678 |

(Continued)

FOREIGN PATENT DOCUMENTS

| DE | 19807718 A1 | 9/1999 |
| DE | 199 00 603 A1 | 7/2000 |

(Continued)

OTHER PUBLICATIONS

German Examination Report in parallel case; dated Mar. 7, 2016.

*Primary Examiner* — Anthony Haughton
*Assistant Examiner* — Yahya Ahmad
(74) *Attorney, Agent, or Firm* — The Law Offices of Roger S. Thompson (57) ABSTRACT

A power electronics module having a base plate, a circuit carrier arranged on the base plate and a plurality of conductor tracks which are electrically insulated from the base plate. A power semiconductor component is arranged on one of the conductor tracks, and has a load connection element. In this case, the base plate has a substantially continuous first recess and the circuit carrier has a substantially continuous second recess, wherein the first and second recesses are arranged such that they are in alignment with one another. The load connection element has a first contact device which is in electrically conductive contact with a contact area of that side of the conductor track which is averted from the base plate, a second contact device for externally making contact with the circuit carrier, and a connecting section, which extends through the first and second recesses, between the first and second contact devices.

25 Claims, 4 Drawing Sheets

(51) Int. Cl.
*H01L 23/367* (2006.01)
*H01L 23/373* (2006.01)
*H01L 23/498* (2006.01)
*H01L 23/043* (2006.01)
*H01L 23/00* (2006.01)
*H01L 23/473* (2006.01)
*G01R 19/00* (2006.01)

(52) U.S. Cl.
CPC ........ *H01L 23/3735* (2013.01); *H01L 23/473* (2013.01); *H01L 23/49838* (2013.01); *H01L 23/49861* (2013.01); *H01L 24/48* (2013.01); *H05K 7/1432* (2013.01); *H05K 7/209* (2013.01); *H01L 2224/4813* (2013.01); *H01L 2224/4846* (2013.01); *H01L 2224/48091* (2013.01); *H01L 2224/48175* (2013.01); *H01L 2224/48472* (2013.01)

(58) Field of Classification Search
CPC ........... H01L 23/3735; H01L 23/49861; H01L 2224/48472; H01L 2224/4846; H01L 2224/48175; H01L 2224/48091; H01L 2224/4813; H05K 7/209; H05K 7/1432; G01R 19/0092

USPC .................................................. 361/702–723
See application file for complete search history.

(56) References Cited

U.S. PATENT DOCUMENTS

| 2007/0188692 | A1* | 8/2007 | Fukusako | H01L 23/50 349/150 |
| 2007/0194429 | A1* | 8/2007 | Lederer | H01L 24/72 257/688 |
| 2015/0069599 | A1* | 3/2015 | Gobl | H01L 24/72 257/719 |
| 2015/0325494 | A1* | 11/2015 | Kroneder | H01L 23/4006 361/715 |

FOREIGN PATENT DOCUMENTS

DE 10 2004 025 609 12/2005
DE 10 2009 024 369 A1 12/2010

* cited by examiner

POWER ELECTRONICS MODULE WITH LOAD CONNECTION ELEMENTS

BACKGROUND OF THE INVENTION

1. Field of the Invention

The invention is directed to a power electronics module having a base plate, a housing and also load connection elements which can preferably also be designed as plug contacts.

2. Description of the Related Art

A power semiconductor module which is in screw pressure contact-connection with a printed circuit board is known from the prior art, by way of example, as disclosed in German Patent Application No. DE 10 2004 025 609 A1. In this arrangement, the printed circuit board has an insulating substrate with conductor tracks arranged thereon. The power semiconductor module has an insulating plastic housing, a substrate arranged in the plastic housing, conductor tracks, and power semiconductor components which are arranged on the substrate and are connected in a manner suitable for the circuit. Furthermore, the power semiconductor module has power and auxiliary connections, such as gate, auxiliary emitter or sensor connections. In this case, the power connections are in the form of screw connections and the auxiliary connections are designed so as to establish a pressure contact-connection with contact springs. The screws of the screw contact-connection arrangement of the power connections extend through recesses in the printed circuit board and form the pressure supply line for the auxiliary connections. As is illustrated here, and as is moreover routine in the art, the load connections extend through the housing of the power semiconductor module laterally or at the top face, the housing routinely being a plastic housing in the art.

SUMMARY OF THE INVENTION

It is an object the invention to provide a compact power electronics module, wherein the load connection elements can be in the form of plug contacts and, in addition, additional space for further components can be created in the interior of the power semiconductor module.

In a first alternative embodiment, the inventive power electronics module has a base plate, a circuit carrier arranged on the base plate, and a plurality of conductor tracks which are electrically insulated from the base plate. A power semiconductor component is arranged on one of these conductor tracks, having a load connection element. In this case, the base plate has a substantially continuous first recess and the circuit carrier has a substantially continuous second recess, wherein the first and second recesses are arranged such that they are in alignment with one another. The load connection element has a first contact device which is in electrically conductive contact with a contact area of that side of the conductor track which is averted from the base plate, a second contact device for externally making contact with the circuit carrier, and a connecting section, which extends through the first and second recesses, between the first and second contact devices.

In a second alternative embodiment, the inventive power electronics module has a base plate, a circuit carrier arranged on the base plate and a plurality of conductor tracks which are electrically insulated from the base plate. A power semiconductor component is arranged on one of the conductor tracks, having an internal connecting device which is in the form of a film composite comprising an electrically insulating film and an inherently structured, electrically conductive film which forms conductor tracks. The power semiconductor module further includes a load connection element. In this case, the base plate has a substantially continuous first recess and the connecting device has a substantially continuous third recess, wherein the first and third recesses are arranged such that they are in alignment with one another. The load connection element has a first contact device which is in electrically conductive contact with a contact area of that side of the conductor track of the connecting device which is averted from the base plate, a second contact device for externally making contact with the circuit carrier, and a connecting section, which extends through the first and third recesses, between the first and second contact devices.

When there are a plurality of load connection elements, it is also possible, in principle, for the load connection elements to be present in one power electronics module in the alternatives.

Here and in the text which follows, a substantially continuous recess is intended to be understood to mean a recess which extends through an object from one side to the opposite side.

It goes without saying that the features cited in the singular, in particular the power semiconductor module and the load connection element, can be present severally in the respective module according to the invention, provided that this is not precluded per se.

Owing to the refinement of the power electronics module according to one of the two alternatives, it is possible, in a simple manner, for the second contact device to be in the form of a plug connection. In addition, it is then possible, in a very simple manner, to arrange further components, in particular a capacitor, in the installation space above the circuit carrier.

In a particular refinement of the invention, it is preferred when the base plate is in the form of a cooling device, preferably an air cooling device having a plurality of cooling fingers or cooling fins. As an alternative, the base plate can also be in the form of a liquid cooling device, particularly at high powers or with a high degree of integration of the circuit carrier. In the simplest refinement of the base plate, the base plate is designed to be arranged on an external cooling device.

The circuit carrier is preferably in the form of a substrate having a ceramic insulation device, in particular in the form of an AMB or a DCB substrate, or in the form of a leadframe which has an insulation film for electrical insulation from the base plate. As an alternative to this, the base plate and the circuit carrier together can be in the form of an IMS substrate. In this case, the base plate and the circuit carrier form an integral unit.

The power electronics module preferably has a uni- or multipartite, preferably cup-like, housing which is arranged on the base plate.

It is particularly preferred when an insulation device for electrically insulating the load connection element, in particular the connecting section of the load connection element, from the base plate, is arranged in the region of the first recess.

The connecting section, and therefore the load connection element itself, is preferably fixed to the base plate by a fastener. In this case, the fastener can connect the first contact section to the associated contact area of the conductor track in a force-fitting manner. The fastener is preferably in the form of a screw which acts on a screw thread of the connecting section of the load connection element. Owing to this refinement, the circuit carrier can be pushed onto the base plate, as a result of which the transfer of heat from the circuit carrier to the base plate is significantly improved.

Furthermore, in an advantageous refinement, a current sensor can be arranged around the connecting section of the load connection element, preferably so as to partially surround the connecting section. Here, "partially surround" is intended to be understood to mean, in particular, that the connecting section is not surrounded by the current sensor over its entire length.

In this case, it may be advantageous when the current sensor is arranged on that side of the circuit carrier or of the connecting device which is averted from the base plate. To this end, the first contact device can be of cup-like design, as a result of which the first contact device therefore surrounds the current sensor. As an alternative to this, the first contact device can be of yoke-like, U-shaped or bow-like design, as a result of which the first contact device only partially surrounds the current sensor.

It may also be advantageous when the current sensor is arranged partially or completely in a, preferably dis-continuous, extension of the first recess in the base plate.

It goes without saying that the various refinements of the invention can be realized individually or in any desired combinations in order to achieve improvements. In particular, the features mentioned and explained above can be used not only in the specified combinations but also in other combinations or on their own, without departing from the scope of the present invention.

Other objects and features of the present invention will become apparent from the following detailed description of the presently preferred embodiments, considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

DETAILED DESCRIPTION OF THE PRESENTLY PREFERRED EMBODIMENTS

Figure 1:
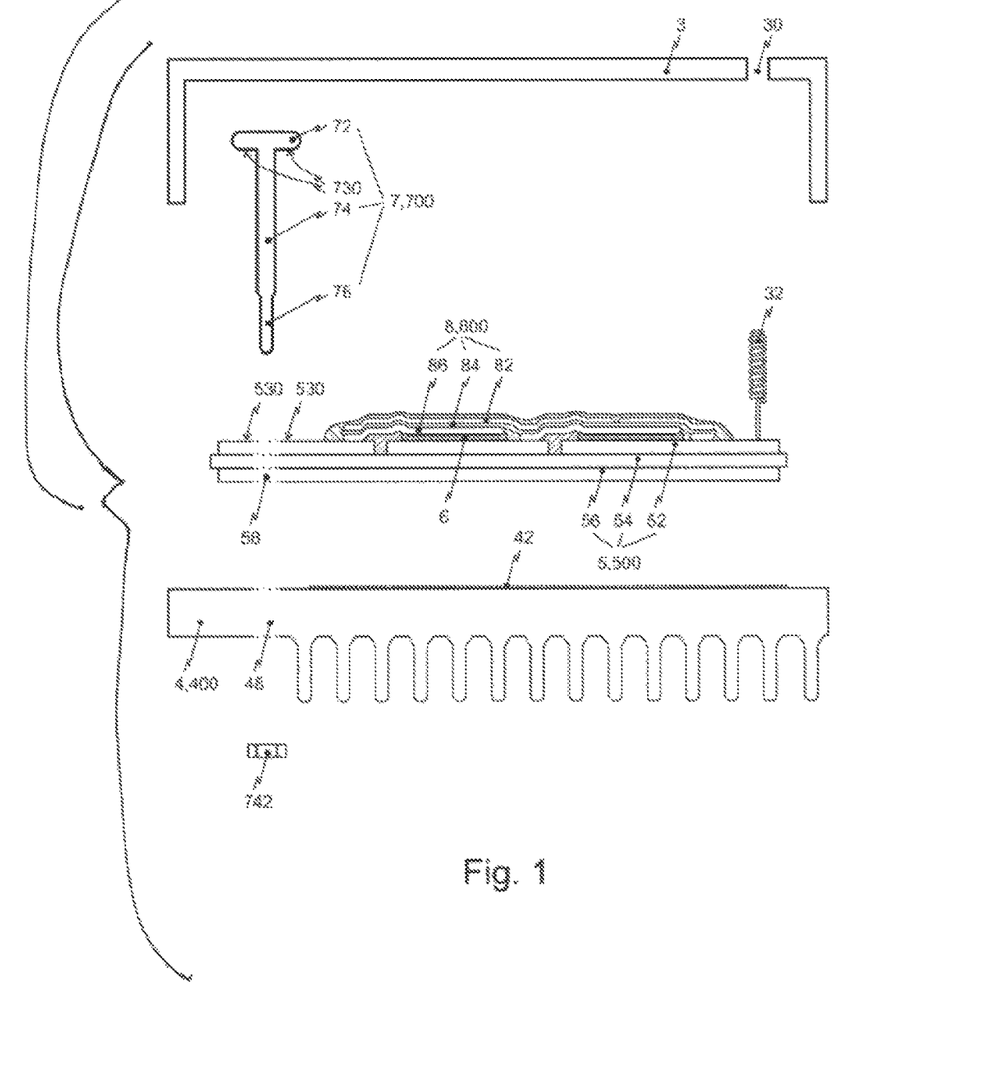
FIG. 1 is an exploded illustration of a refinement of the first alternative of the inventive power electronics module.

FIG. 1 shows an exploded illustration of a refinement of the first alternative of the inventive power electronics module 1. FIG. 1 shows a base plate 4, here in the form of an air cooling device 400 having a plurality of cooling fins. Furthermore, base plate 4 has a substantially continuous first recess 48. First recess 48 extends through base plate 4 from a main area on which a circuit carrier 5 is arranged. In a manner routine in the art, a thermally conductive paste 42 is additionally provided on the main area on which circuit carrier 5 is arranged.

FIG. 1 also shows circuit carrier 5, here in the form of a DCB substrate 500 which is routine in the art and has a flat ceramic insulating body 54 and metal laminations 52, 56 which are arranged on the surfaces of insulating body 54. The metal lamination which is averted from base plate 4 is inherently structured and forms conductor tracks 52 of circuit carrier 5.

Power semiconductor components 6 are arranged on conductor tracks 52 of circuit carrier 5, once again in a manner routine in the art, and are electrically conductively connected to one another by an internal connecting device 8 in a manner suitable for the circuit. Here, connecting device 8 is in the form of a film composite 800 which is routine in the art and comprises two electrically conductive films 82, 86 with an electrically insulating film 84 arranged between electrically conductive films 82, 86. Electrically conductive films 82, 86 are inherently structured and form dedicated conductor tracks 82, 86 of connecting device 8. If necessary for circuit-related reasons, plated-through holes can be provided between conductive films 82, 86.

Furthermore, circuit carrier 5 has a second substantially continuous recess 58 which extends from the surface of the top metallic lamination 52, through insulating body 54, to the surface of the second metallic lamination 56. This second recess 58 is in alignment with the first recess 48 in base plate 4. However, in this case, it is not necessary for the two recesses 48, 58 to have the same diameter. It is important that a load connection element 7 can extend through the two said recesses. A contact area 530 for electrical connection to a load connection element 7 is arranged laterally adjacent to the second recess 58.

Here, this load connection element 7, 700 is rotationally symmetrical and of T-shaped cross section and has a first and a second contact device 72, 76 and also a connecting section 74 which connects the contact devices. The first contact device 72 is in electrically conductive contact with a conductor track 52 of circuit carrier 5 by virtue of the contact area 730 of the first contact device 72 being in electrically conductive contact with the associated contact area 530 of conductor track 52. The connecting section 74 extends through first and second recesses 48, 58 and therefore through circuit carrier 5 and base plate 4, and ends in the second contact section 76 which is on that side of base plate 4 which is averted from circuit carrier 5 and is in the form of a plug contact.

Figure 4:
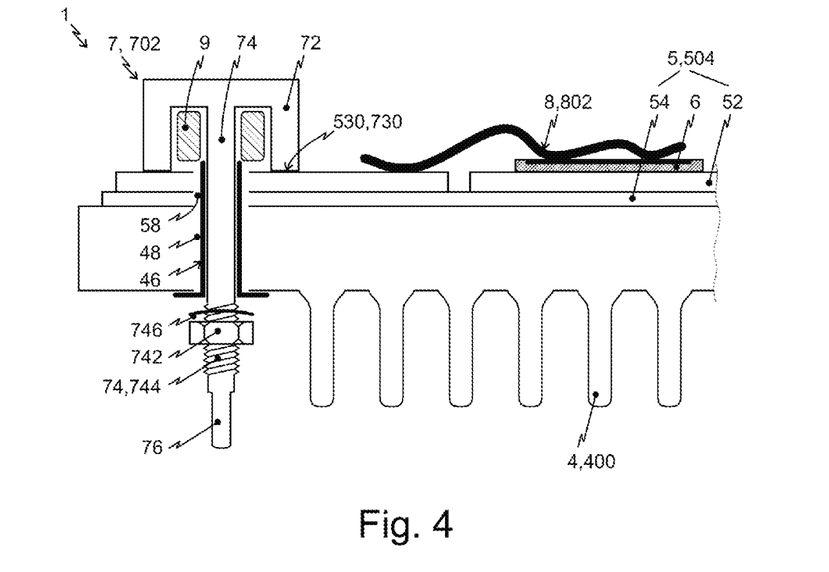
FIGS. 4 and 5 show refinements of the first alternative of the inventive power electronics module, in each case with a current sensor.

For the purpose of fixing the load connection element 7, a screw 742 is further illustrated, the exact function of screw 742 being explained in the description relating to FIG. 4.

Furthermore, FIG. 1 shows a unipartite cup-like housing 3 which rests on base plate 4 by way of lateral sections, as a result of which circuit carrier 5 is arranged in the interior of the power electronics module 1. Furthermore, the housing 3 has a recess 30 for an auxiliary connection element which is in the form of a spring contact 32 and transmits, by way of example, sensor signals.

Figure 2:
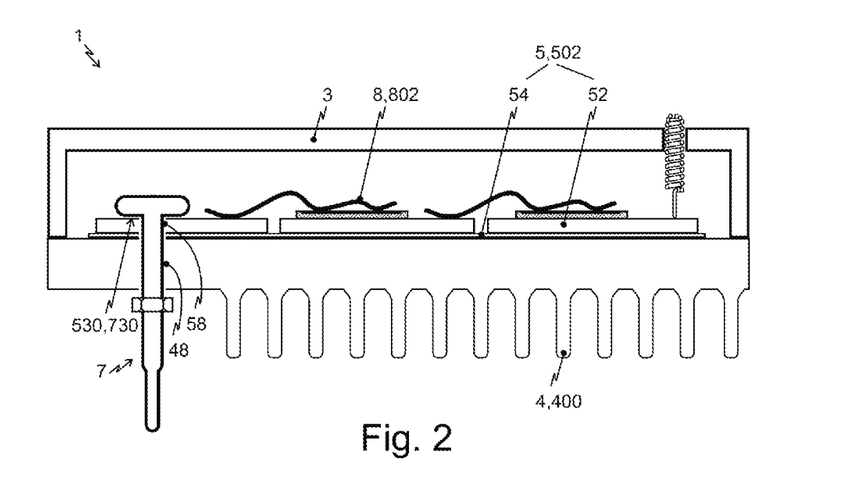
FIG. 2 shows a further refinement of the first alternative of the inventive power electronics module.

FIG. 2 shows a further refinement of the first alternative of the inventive power electronics module 1 which is substantially analogous to that according to FIG. 1. The main difference is in the design of circuit carrier 5 and the different design of the internal connecting device 8 which is fundamentally independent of the design of circuit carrier 5.

Here, circuit carrier 5 is in the form of a leadframe 502, that is to say in the form of a thin, flat and inherently structured shaped metal body which forms individual conductor tracks 52 owing to this structuring. For the purpose of providing electrical insulation, in particular, from base plate 4, a, substantially unstructured, insulating film 54 is arranged between base plate 4 and conductor tracks 52. One of these conductor tracks 52, and therefore also the insulating film 54, has a second recess 58, that of circuit carrier 5. This second recess 58 is once again in alignment with the first recess 48 in base plate 4.

Here, the internal connecting device 8 is in the form of a wire bonding connection 802, as is routine in the art.

Figure 3:
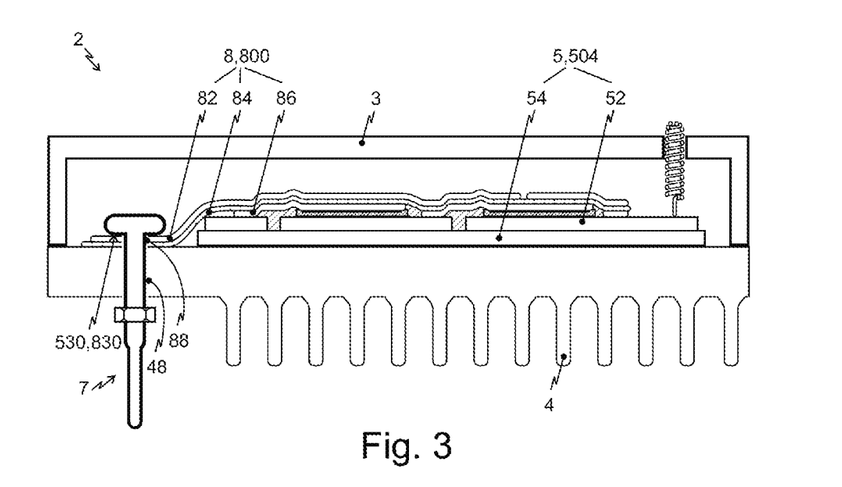
FIG. 3 shows a refinement of the second alternative of the inventive power electronics module.

FIG. 3 shows a refinement of the second alternative of the inventive power electronics module 2. In this case, base plate 4, the housing 3 and the load connection element 6 are once again designed as described with respect to FIG. 1. Circuit carrier 5 has an insulating ceramic 54 and conductor tracks 52 which are arranged on the insulating ceramic 54. Power semiconductor components 6 are arranged on these conductor tracks 52 and are electrically conductively connected by a film composite 800 in a manner suitable for the circuit, fundamentally in an identical manner with respect to FIG. 1.

However, here, this film composite 800 additionally also serves for connection to the load connection element 7. To this end, the film composite 800 projects laterally beyond circuit carrier 5. In this region in which the film composite 800 projects beyond circuit carrier 5, the electrically insulating film 84 serves to insulate the first, top electrically conductive film 82 from base plate 4. A substantially continuous third recess 88 now extends through these two films 82, 84, in alignment with the first recess 48 of base plate 4 for arrangement of the load connection element 7.

In this case, the contact area 730 of the first contact device 72 is in electrically conductive contact with the associated contact area 830 of conductor track 82 of connecting device 800.

Figure 5:
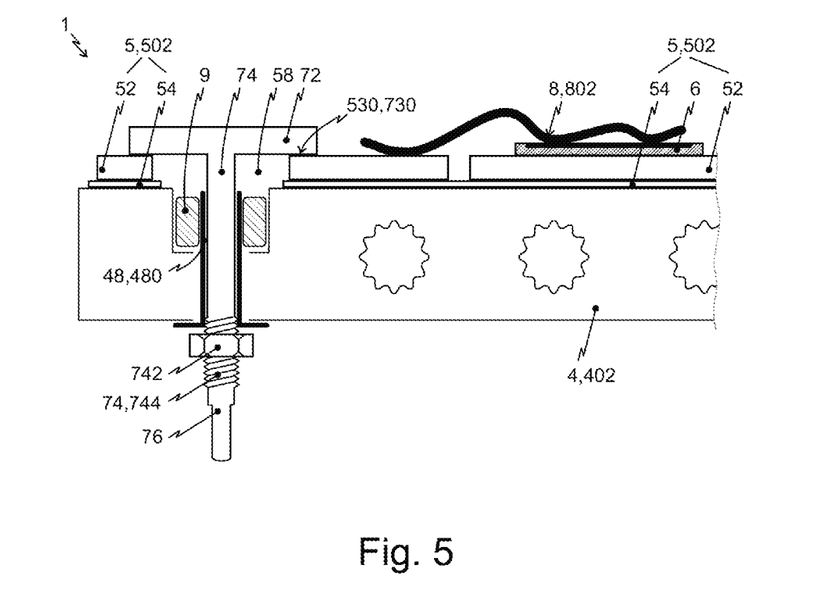

FIGS. 4 and 5 show refinements of the first alternative of the power electronics module 1, in each case with a current sensor 9. A base plate 4 in the form of an air cooling device 400 is once again illustrated in FIG. 4. Base plate has the substantially continuous first recess 48 already described above. Circuit carrier 5 is of analogous design to that in respect of FIG. 3, while the internal connecting device 8 is of analogous design to that according to FIG. 2.

The figures additionally show an insulation device 46 which extends through first and second recesses 48, 58 and serves to electrically insulate the connecting section 74 of the load connection element 7 from base plate 4. The figures show a certain overlap of the insulation device 46, this overlap serving to ensure requisite insulation distances, so-called air and creepage paths.

Here, the first contact device 72 of the load connection element 7 is rotationally symmetrical and of cup-like design. The first contact device 72 therefore has a contact area 730, which is in the form of a cylindrical casing, to the associated contact area 530 of conductor track 52 of circuit carrier 5. The connecting section 74 of the load connection element 7 protrudes from the center of this first contact device 72 and extends through a current sensor 9. This current sensor 9 is therefore arranged above circuit carrier 5 in the cup-like first contact device 72. The necessary connections of the current sensor 9 are formed either by circuit carrier 5 or by being passed through the cup-like first contact device 72 in an insulated manner.

As described, the current sensor 9 partially surrounds the connecting section 74. In its further profile, the connecting section 74 extends through first and second recesses 48, 58.

Thereafter, the connecting section 74 has a screw thread 744 which reaches approximately as far as the second contact device 76 of the load connection element 7.

The connecting section 74 is fixed to base plate 4 for the purpose of reliable electrical pressure contact-connection of the respective contact areas 530, 730 of the first contact device 72 and conductor track 52 of circuit carrier 5. To this end, a nut 742 acts on the screw thread 744 of the connecting section 74. Preferably in order to ensure a permanent action of force, a spring 746, here a plate spring, is arranged as a pressure store between the nut 742 and the insulation device 46 and therefore base plate 4. In addition, if necessary or if advantageous, circuit carrier 5 is pressed against base plate 4 in this way, as a result of which excellent thermal contact is established, it being possible for waste heat to be discharged from circuit carrier 5 to base plate 4 by virtue of the thermal contact.

FIG. 5 shows a module 1 which is designed substantially analogously to that according to FIG. 4. In a different manner, but functionally not necessarily in cooperation, circuit carrier 5, the position of the current sensor 9 and therefore the shape of the first contact device 72 of the load connection element 7 and also the design of base plate 4 differ from those according to FIG. 4. Here, circuit carrier 5 is designed analogously to that according to FIG. 2, while base plate 4 is in the form of a liquid cooling device 402. Three cooling liquid channels are illustrated by way of example.

The current sensor 9 is arranged in a further recess 480 which extends the first recess 48 of base plate 4 but is itself not substantially continuous. In this case, the current sensor 9 can be arranged completely, as illustrated, in this further recess 480 or, as not illustrated, can protrude from base plate 4 in the direction of circuit carrier 5.

In the illustrated refinement, the first contact device 72 can be simpler than according to FIG. 4. It is important that the first contact device 72 rests on a conductor track 52 of circuit carrier 5 such that it makes reliable electrical contact. However, it does not necessarily have to rest only on conductor tracks 52.

Figures 6, 7:
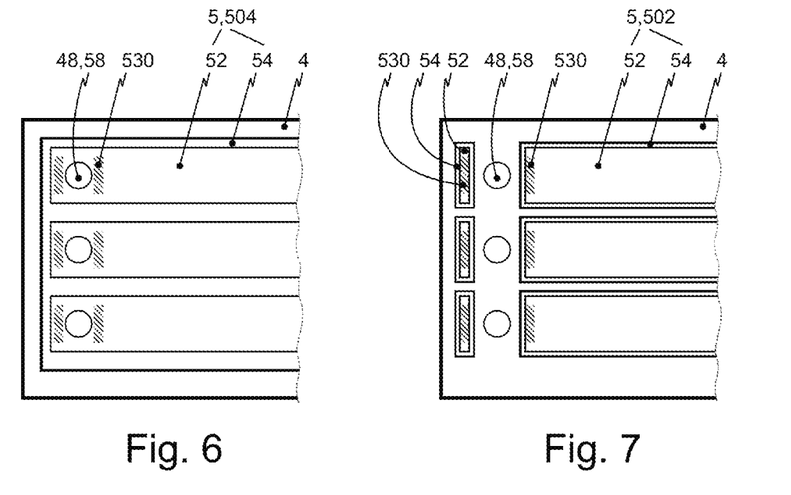
FIGS. 6 and 7 show different refinements of the circuit carrier of the inventive power electronics module.

FIGS. 6 and 7 show different refinements of circuit carrier 5 of the inventinve power electronics module 1. The figures each show a plan view of base plate 4 with circuit carrier 5 arranged on base plate 4.

In FIG. 6, circuit carrier 5 is of analogous design to FIG. 4 and has a ceramic insulating body 54 with three conductor tracks 52 arranged on insulating body 54. Here, each of these conductor tracks 52 has two contact areas 530 which are arranged adjacent to first and second recesses 48, 58.

In FIG. 7, circuit carrier 5 is designed fundamentally according to FIG. 5, but here has individual insulation films 54 on which conductor tracks 52 of leadframe 502 are located. In each case one insulation film 54 with a conductor track 52 located on it is likewise arranged to the left of and adjacent to first and second recesses 48, 58, which are in alignment with one another, for each recess. However, these conductor tracks 52 are not in electrically conductive contact with a power semiconductor component 6 or further conductor tracks of circuit carrier 5. Within the scope of this invention, a refinement of this kind should also be understood by the term "the second recess which is substantially continuous through the circuit carrier" or the like.

Figure 8:
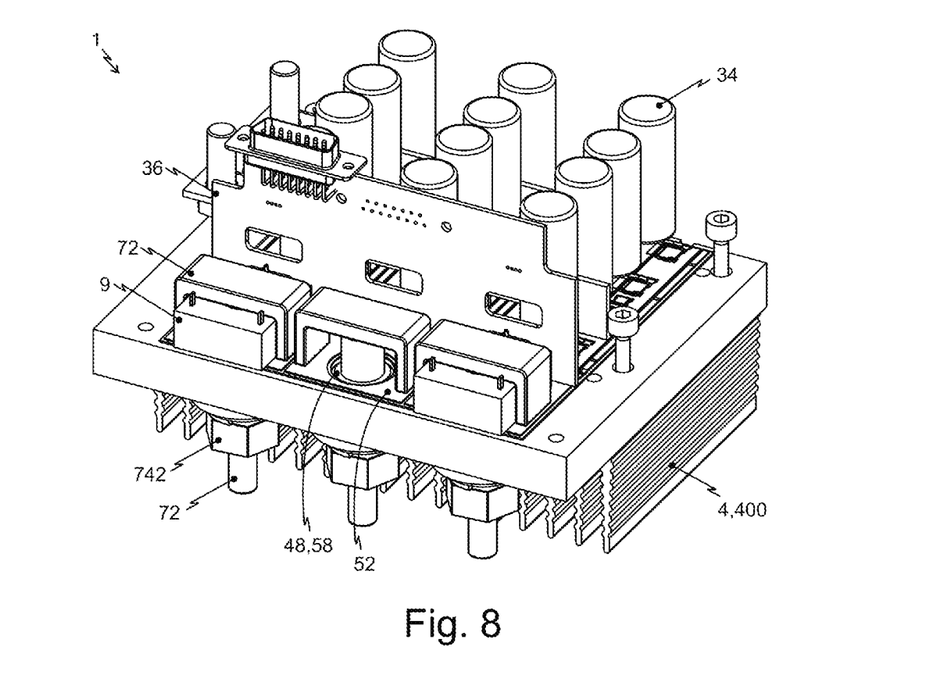
FIG. 8 is a three-dimensional illustration of the first alternative of the inventive power electronics module.

FIG. 8 is a three-dimensional illustration of the first alternative of inventive power electronics module 1, without the housing for reasons of clarity. FIG. 8 shows a base plate 4 which is in the form of an air cooling device 400. A circuit carrier 5 in the form of a DCB substrate 500 is arranged on this base plate 4, power semiconductor components 6 being located on and connected to conductor tracks 52 of circuit carrier 5 in a manner suitable for the circuit.

FIG. 8 also shows a capacitor 34 for supplying DC voltage to the power electronics circuit which is formed on circuit carrier 5, and also shows a drive device 34 for controlling the power semiconductor components 6.

Three load connection elements 7 are provided for externally making contact with the power electronics circuit, the load connection elements each extending to the outside through a second recess 58 in circuit carrier 5 and also through a first recess 48, which is in alignment with the second recess, in base plate 4, here the air cooling device 400.

The load connection elements 7 have bow-like first contact devices 72 for the purpose of allowing the respective conductor tracks 52 to make contact. Two of these first contact devices 72 engage around in each case one associated current sensor 9. The connecting section 74 of the respective load connection element 7, which connecting section starts from the first contact device 72, extends through this current sensor 9. Furthermore, the load connection elements 7 are designed as described with respect to FIG. 4.

In the preceding Detailed Description, reference was made to the accompanying drawings, which form a part of this disclosure, and in which are shown illustrative specific embodiments of the invention. In this regard, directional terminology, such as "top", "bottom", "left", "right", "front", "back", etc., is used with reference to the orientation of the Figure(s) with which such terms are used. Because components of embodiments can be positioned in a number of different orientations, the directional terminology is used for purposes of ease of understanding and illustration only and is not to be considered limiting.

Additionally, while there have been shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A power electronics module comprising:
a base plate having a substantially continuous first recess;
a circuit carrier which is arranged on said base plate and has a substantially continuous second recess, said first and second recesses being disposed such that they are in alignment with one another;
a plurality of conductor tracks which are electrically insulated from said base plate, wherein one of said conductor tracks is adapted to receive a power semiconductor component, said one of said conductor tracks having a side which is averted from said base plate, said side of said one conductor track which is averted from said base plate having a contact area; and
a load connection element having
a first contact device which is in electrically conductive contact with said contact area of said side of said conductor track which is averted from said base plate,
a second contact device for externally making contact with said circuit carrier, and
a connecting section, which extends through said first and second recesses, between said first and second contact devices.

2. A power electronics module comprising:
a base plate having a substantially continuous first recess;
a circuit carrier which is arranged on said base plate;
a plurality of conductor tracks which are electrically insulated from said base plate, wherein one of said conductor tracks is adapted to receive a power semiconductor component, said one of said conductor tracks having an internal connecting device with a substantially continuous third recess, said internal connecting device being in the form of a film composite comprising an electrically insulating film and an inherently structured, electrically conductive film which forms conductor tracks, said first and third recesses being arranged such that they are in alignment with one another; and
a load connection element which includes
a first contact device which is in electrically conductive contact with said contact area of said side of said conductor track which is averted from said base plate,
a second contact device for externally making contact with said circuit carrier, and
a connecting section, which extends through said first and third recesses, between said first and second contact devices.

3. The power semiconductor module of claim 1, wherein said base plate is in the form of a cooling device.

4. The power semiconductor module of claim 3, wherein said cooling device is an air cooling device having a plurality of cooling fingers or cooling fins.

5. The power semiconductor module of claim 1, wherein said circuit carrier is in the form of a substrate having a ceramic insulation device.

6. The power semiconductor module of claim 5, wherein said substrate is selected from the group consisting of: an AMB substrate, a DCB substrate, and a leadframe which has an insulation film for electrical insulation from said base plate.

7. The power semiconductor module of claim 1, wherein said base plate and said circuit carrier together are in the form of an IMS substrate.

8. The power semiconductor module of claim 1, wherein said module further comprises a housing which is arranged on said base plate.

9. The power semiconductor module of claim 8, wherein said housing is generally in the shape of a cup.

10. The power semiconductor module of claim 1, further comprising an insulation device for electrically insulating said load connection element from said base plate is arranged in the region of said first recess.

11. The power semiconductor module of claim 10, wherein said insulation device insulates said connecting section of said load connection element from said base plate.

12. The power semiconductor module of claim 1, further comprising a fastener for fixing said connecting section to said base plate.

13. The power semiconductor module of claim 12, wherein said fastener connects said contact area of said first contact device to an associated contact area of said conductor track in a force-fitting manner.

14. The power semiconductor module of claim 12, wherein said fastener is in the form of a screw connection having a nut and a screw thread located in said connecting section of said load connection element, wherein said nut interacts with said screw thread.

15. The power semiconductor module of claim 1, further comprising a current sensor arranged around said connecting section of said load connection element, preferably so as to partially surround said connecting section.

16. The power semiconductor module of claim 15, wherein said current sensor partially surrounds said connecting section of said load connection element.

17. The power semiconductor module of claim 15, wherein said current sensor is arranged on that side of said circuit carrier which is averted from said base plate.

18. The power semiconductor module of claim 2, further comprising:
a current sensor arranged around said connecting section of said load connection element;
wherein said current sensor is arranged on said side of said connecting device which is averted from said base plate.

19. The power semiconductor module of claim 15, wherein said first contact device has a cup-like shape and surrounds said current sensor.

20. The power semiconductor module of claim 15, wherein said first contact device is shaped like one of the group consisting of a yoke-like shape, U-shaped and a bow-like shape, and partially surrounds said current sensor.

21. The power semiconductor module of claim 18, wherein said first contact device is shaped like one of the group consisting of a yoke-like shape, U-shaped and a bow-like shape, and partially surrounds said current sensor.

22. The power semiconductor module of claim 15, wherein said current sensor is arranged in an extension of said first recess in said base plate.

23. The power semiconductor module of claim 22, wherein said extension of said first recess in said base plate is non-substantially continuous therewith.

24. The power semiconductor module of claim 18, wherein said current sensor is arranged in an extension of said first recess in said base plate.

25. The power semiconductor module of claim 24, wherein said extension of said first recess in said base plate is non-substantially continuous therewith.

* * * * *